US012592700B2

(12) United States Patent
Jeong et al.

(10) Patent No.: US 12,592,700 B2
(45) Date of Patent: Mar. 31, 2026

(54) LOGIC OPTIMIZING POWER SWITCH ENABLE DELAY

(71) Applicant: QUALCOMM Incorporated, San Diego, CA (US)

(72) Inventors: Jihoon Jeong, Cary, NC (US); Vinay Patel, Stouffville (CA); Jae Gon Lee, Mountain View, CA (US); Akshay Dua, San Jose, CA (US); Ayush Singh, San Jose, CA (US); Xiang Hu, San Jose, CA (US); Sai Akshit Kumar Gampa, Austin, TX (US); Vishal Srinivasan Iyer, San Jose, CA (US); Nitin Makhija, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/763,329

(22) Filed: Jul. 3, 2024

(65) Prior Publication Data

US 2026/0012177 A1      Jan. 8, 2026

(51) Int. Cl.
*H03K 19/0185* (2006.01)
*H03K 19/00* (2006.01)

(52) U.S. Cl.
CPC . *H03K 19/0016* (2013.01); *H03K 19/018557* (2013.01); *H03K 19/0013* (2013.01)

(58) Field of Classification Search
CPC ....... H03K 19/0016; H03K 19/018557; H03K 19/0013
USPC .......................... 327/392, 393, 394, 399, 544
See application file for complete search history.

(56) References Cited

U.S. PATENT DOCUMENTS

2006/0055391 A1* 3/2006 Kuang ............... H03K 19/0016
                                                  323/371
2011/0198942 A1   8/2011 Takayanagi et al.
2012/0249213 A1* 10/2012 Chu ................... H03K 19/0016
                                                  327/403
2013/0106494 A1* 5/2013 Takayanagi .......... H03K 17/284
                                                  327/434
2013/0111254 A1* 5/2013 Takayanagi ............. G06F 1/189
                                                  713/401
2019/0115919 A1* 4/2019 Kim ................. H03K 19/00369

FOREIGN PATENT DOCUMENTS

WO        2020149954 A1    7/2020

OTHER PUBLICATIONS

International Search Report and Written Opinion PCT/US2025/033238 ISA/EPO Oct. 14, 2025.

* cited by examiner

*Primary Examiner* — William Hernandez
(74) *Attorney, Agent, or Firm* — Patterson + Sheridan LLP

(57) ABSTRACT

Certain aspects of the present disclosure are directed towards techniques for power management. The techniques provide an optimal staggering delay time between transmission of enable signals to power switches coupled (e.g., electrically coupled) to logic circuits and a power source. The optimal staggering delay time may allow enabling or turning on of the power switches in a staggered, sequential fashion while reducing power up latency of the logic circuits.

18 Claims, 11 Drawing Sheets

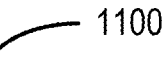

1100

Receive, by a power gating circuit, a plurality of enable signals from a set of enable signals at different times for enabling a plurality of power switches of the power gating circuit, wherein one or more values of a time delay period between any two enable signals of the plurality of enable signals are configurable, and wherein the power gating circuit is associated with one or more logic circuits and a power source

1110

Enable, by the power gating circuit, the plurality of power switches at the different times based on the plurality of enable signals

LOGIC OPTIMIZING POWER SWITCH ENABLE DELAY

TECHNICAL FIELD

Certain aspects of the present disclosure generally relate to electronic circuits, and more particularly, to power management for an electronic device.

BACKGROUND

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. An electronic device like a smartphone may depend on a battery to operate. The life of the battery may be dependent on the power consumption of circuitry on the electronic device. Some circuitry, such as a low dropout (LDO) regulator, may consume power even when inactive.

As a number of transistors included on an integrated circuit chip continues to increase, power management in integrated circuits continues to increase in importance. Power management can be critical to the integrated circuits that are included in the electronic device. The electronic device may often rely on battery power, and reducing power consumption in the integrated circuits of the electronic device can increase the life of a battery of the electronic device. Additionally, reducing power consumption can reduce the heat generated by the integrated circuits, which can reduce cooling requirements in the electronic device that includes the integrated circuit.

Clock gating may be used to reduce dynamic power consumption in the integrated circuit (e.g., disabling a clock to idle circuitry and thus preventing switching in the idle circuitry). Additionally, some integrated circuits have implemented power gating to reduce static power consumption (e.g., consumption due to leakage currents). With the power gating, the power to a ground path of the idle circuitry of the electronic device is interrupted (e.g., and thereby reducing the leakage current to near zero).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects are directed towards an apparatus for power management. The apparatus generally includes one or more logic circuits, and a power gating circuit associated with (or coupled with) the one or more logic circuits and a power source. The power gating circuit includes a plurality of power switches and is configured to: receive a plurality of enable signals from a set of enable signals at different times for enabling the plurality of power switches where one or more values of a time delay period between any two enable signals of the plurality of enable signals are configurable;

and enable the plurality of power switches at the different times based on the plurality of enable signals.

Certain aspects are directed towards a method for power management by a power gating circuit. The method generally includes: receiving a plurality of enable signals from a set of enable signals at different times for enabling a plurality of power switches of the power gating circuit, wherein one or more values of a time delay period between any two enable signals of the plurality of enable signals are configurable and the power gating circuit is associated with (or coupled with) one or more logic circuits and a power source; and enabling the plurality of power switches at the different times based on the plurality of enable signals.

Other aspects provide: an apparatus operable, configured, or otherwise adapted to perform the aforementioned methods as well as those described elsewhere herein; a non-transitory, computer-readable media comprising instructions that, when executed by one or more processors of an apparatus, cause the apparatus to perform the aforementioned methods as well as those described elsewhere herein; a computer program product embodied on a computer-readable storage medium comprising code for performing the aforementioned methods as well as those described elsewhere herein; and an apparatus comprising means for performing the aforementioned methods as well as those described elsewhere herein. By way of example, an apparatus may comprise a processing system, a device with a processing system, or processing systems cooperating over one or more networks.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 11 is a flow diagram illustrating example operations for power management, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
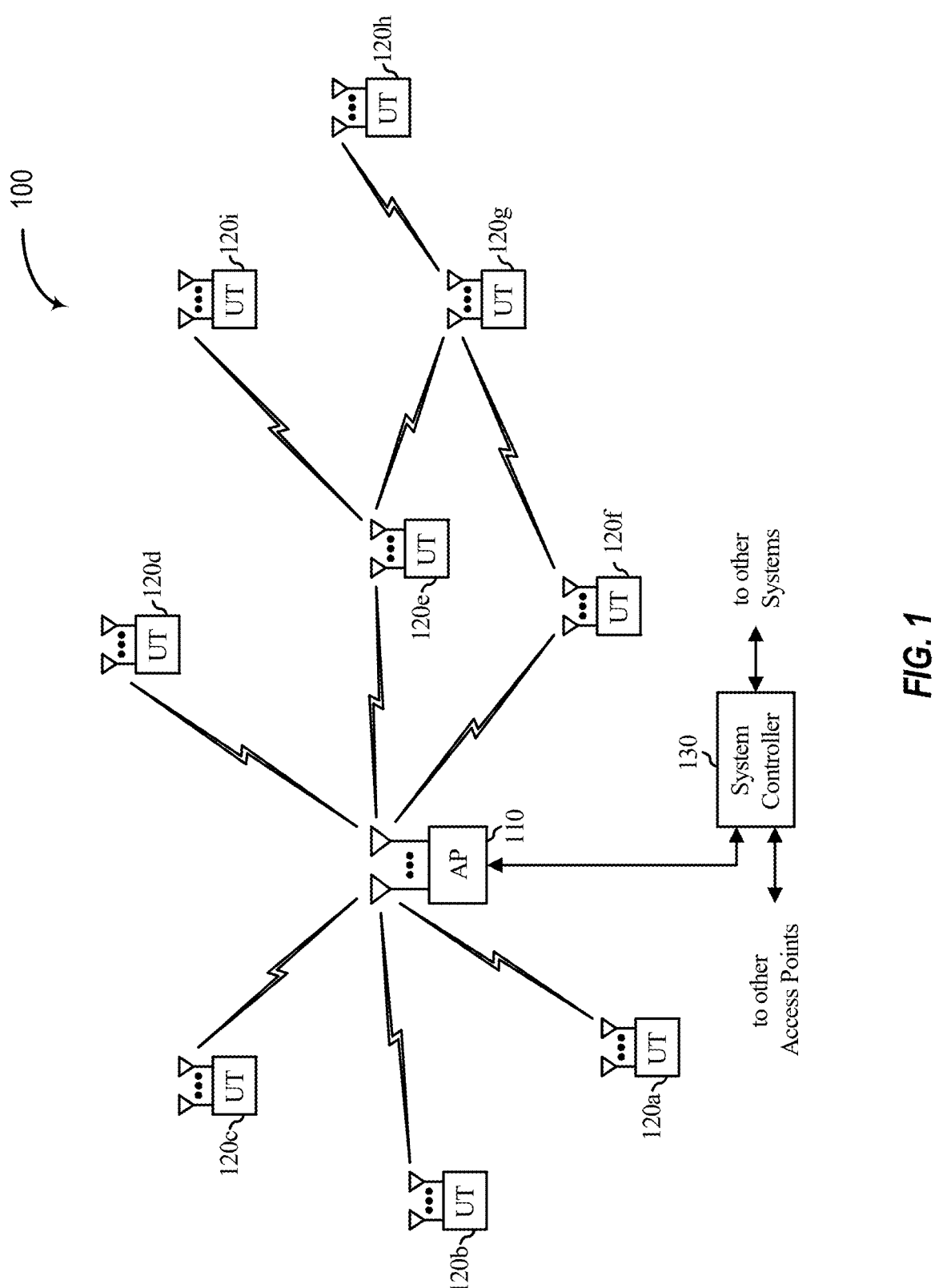
FIG. 1 illustrates a wireless communications system with access points and user terminals, in which aspects of the present disclosure may be practiced.

Certain aspects of the present disclosure generally relate to an apparatus for optimizing a delay time between staggered enable signals to power switches to reduce power up latency of logic circuits coupled to the power switches.

Power gating is a technique that cuts off power supply from a power source to the logic circuits that are not in use. For example, the logic circuits that are not in use are temporarily turned off to reduce an overall power consumption at a system-on-chip (SoC). This temporary shutdown time is called as "low power mode" or "inactive mode". When the logic circuits are required for operation once again, the logic circuits are activated to "active mode". These two modes are switched at an appropriate time and in a suitable manner to maximize power performance while minimizing impact to performance of a device including the logic circuits.

Power gating can be implemented by using a power gating module including a controller and devices such as the power switches (e.g., which may be electrically coupled to the power source and the logic circuits). The power switches may turn on and off power from the power source to the logic circuits. In one example, power gating may use low-leakage transistors (e.g., p-channel metal-oxide semiconductor (PMOS) transistors) as header switches to turn on or shut off power supplies from the power source to the logic circuits. In another example, power gating may use transistors (e.g., n-channel metal-oxide semiconductor (NMOS) transistors) as footer switches to turn on or shut off the power supplies from the power source to the logic circuits.

Some aspects of the present disclosure generally relate the power gating module, which may create power switch enable signals for the power switches. The enable signals are routed by the power gating module to respective power switches. For example, the enable signals may be sequentially released (e.g., released in a staggered fashion) to the power switches, so that the power switches are enabled sequentially (e.g., and not simultaneously). To do so, the power gating module may include delay units to implement delay periods between the enable signals for the power switches. After expiration of each delay period, the power gating module asserts an enable signal. Thus, the power gating module provides the enable signals to the respective power switches at staggered, different times. As a result, the power switches are sequentially enabled at different times. When all of the power switches are enabled, the logic circuits may then receive all power from the power source.

In some cases, a staggering delay period or time between transmission of the enable signals to the power switches (e.g., coupled to the logic circuit and the power source) may contribute to a longer power up latency of the logic circuit (e.g., since the power switches are not enabled simultaneously). The longer power up latency of the logic circuit may degrade an overall operational performance of the device including the logic circuit.

Techniques described herein provide an optimal staggering delay time between transmission of the enable signals to the power switches (e.g., which may be electrically coupled to the logic circuits and the power source). The optimal staggering delay time may allow enabling or turning on of the power switches in a staggered, sequential fashion while reducing power up latency of the logic circuits.

In one aspect, a configurable value for the optimal staggering delay time between the enable signals to the power switches may be used. The configurable value for the optimal staggering delay time may be determined such that there is no unnecessary delay between the transmission of the enable signals to the power switches. In another aspect, multiple enable signals may be asserted at once to speed up turning on or enabling of the power switches. This may enhance the power up speed of the logic circuits with aid of configurable staggering delays between different sets of the enable signals transmitted to the power switches.

The techniques proposed herein may determine and provide the optimal staggering delay time between the transmission of the enable signals to the power switches, which may reduce the power up latency of the logic circuits, and thereby improve performance and prolong a day of use (DOU) of a machine including such logic circuits.

Example Wireless Communications

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported).

In some aspects, the user terminal 120 or access point 110 may be placed in a deep sleep mode by opening a switch to turn off power to one or more circuits. The switch may be controlled via a level shifter, as described in more detail herein.

Figure 2:
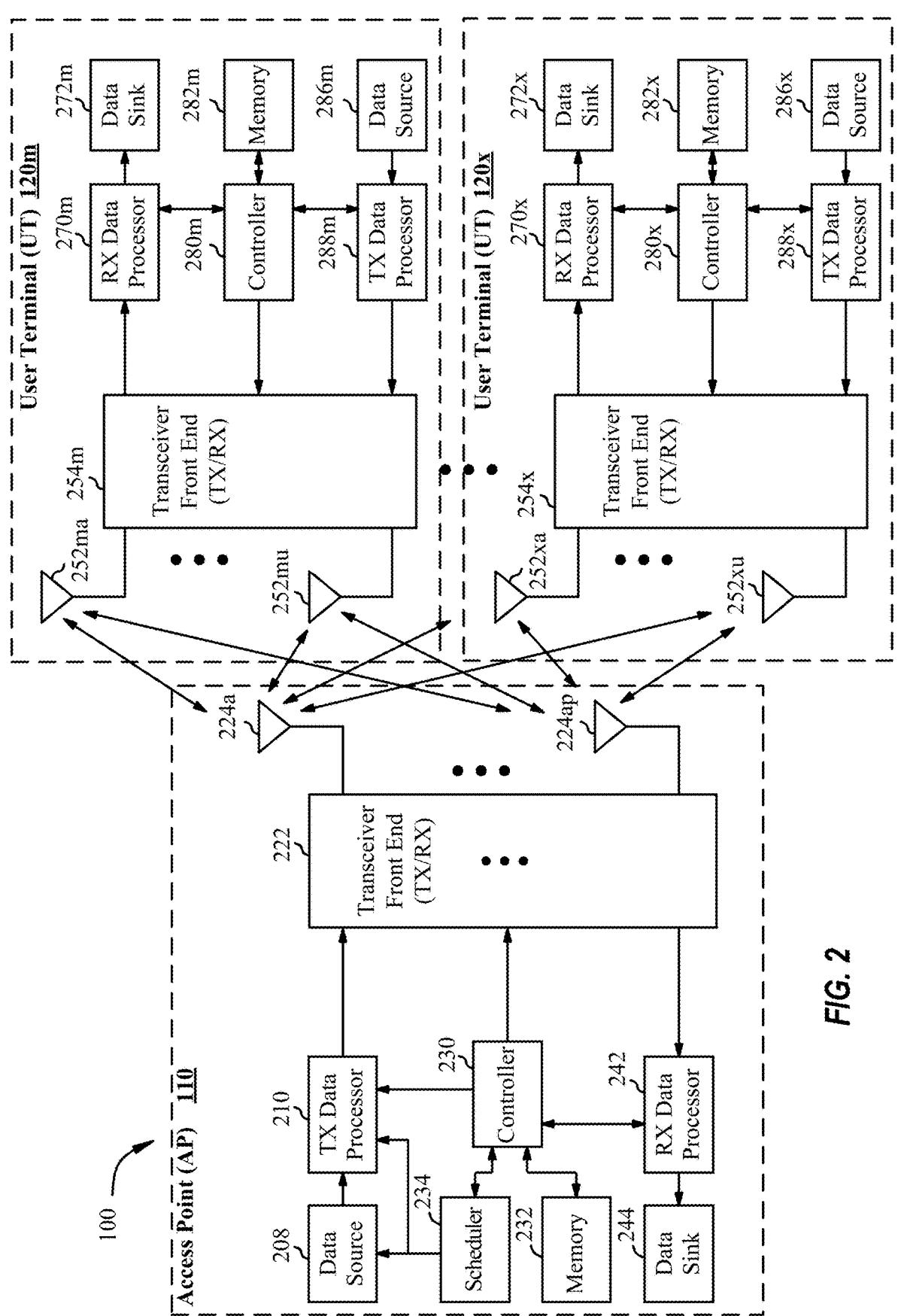
FIG. 2 shows a block diagram of an access point and user terminals, in which aspects of the present disclosure may be practiced.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal (e.g., which may be provided to a data sink 272).

In some aspects, the user terminal 120 or access point 110 may be placed in a deep sleep mode by opening a switch to turn off power to one or more circuits. The switch may be controlled via a level shifter, as described in more detail herein.

Figure 3:
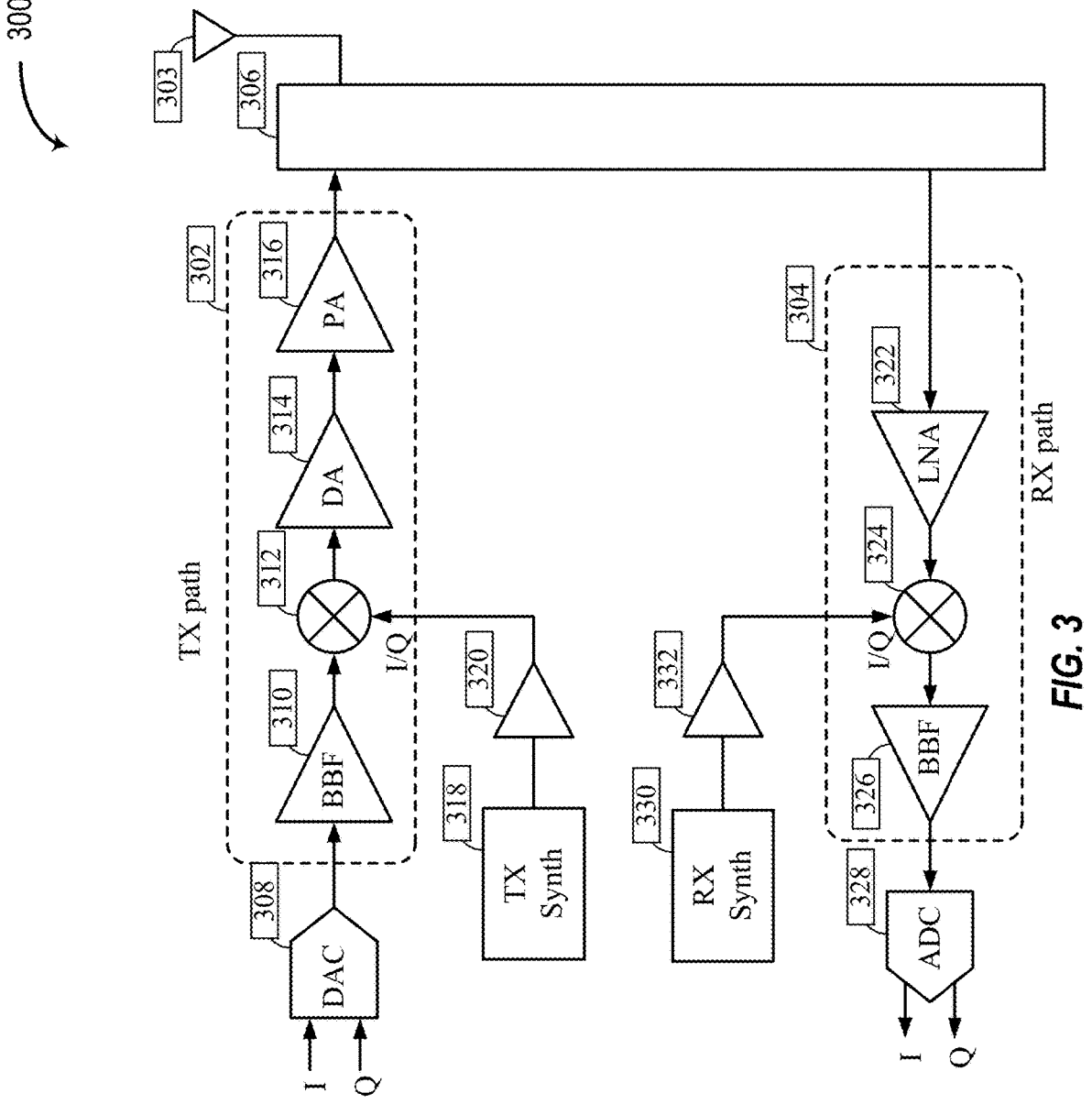
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes at least one transmit (TX) path 302 (also known as a "transmit chain") for transmitting signals via one or more antennas and at least one receive (RX) path 304 (also known as a "receive chain") for receiving signals via the antennas. When the TX path 302 and the RX path 304 share an antenna 303, the paths may be connected with the antenna via an interface 306, which may include any of various suitable radio frequency (RF) devices, such as a switch, a duplexer, a diplexer, a multiplexer, and the like.

Receiving in-phase (I) and/or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, the DA 314, and the PA 316 may be included in a radio frequency integrated circuit (RFIC). In some cases, the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 312 are typically RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In some cases, a single frequency synthesizer may be used for both the TX path 302 and the RX path 304.

In some aspects, a wireless device (e.g., the user terminal 120 or access point 110) may be placed in a deep sleep mode by opening a switch to turn off power to one or more circuits for the transceiver front end 300. The switch may be controlled via a level shifter, as described in more detail herein.

While FIGS. 1-3 describe an example configuration of a wireless communication system to facilitate understanding, the aspects of the present disclosure may be applied to any suitable electronic system or wireless communication system. For example, a wireless communication system may be implemented with a modem integrated circuit (IC), a transceiver IC, and a front-end module. The modem IC may be part of a main system-on-chip (SoC) with an application processor, in some aspects. The modem IC may be coupled to the transceiver IC (e.g., a separate wireless local area network (WLAN) chip or a separate sub-6 GHz software-defined radio (SDR) chip). The transceiver IC may include baseband circuitry, mixers, and pre-amplifiers. The transceiver IC may be coupled to the front-end module including a PA. Certain aspects of the present disclosure may be used to reduce current consumption associated with any components of the wireless communication system (e.g., components of the transceiver IC or the front-end module).

Example Techniques for Deep Sleep Mode

In some implementations, a front-end module (FEM) may be configured in a standby mode to reduce power consumption. During the standby mode (e.g., also referred to as a sleep mode), the current consumption of the FEM may be reduced (e.g., to as low as 10 μA). Certain aspects of the present disclosure are directed towards implementing a deep sleep mode where the current consumption of the FEM may be further reduced (e.g., down to 1 μA). For example, a head switch (or tail switch) may be used to turn off power to specific circuits that would otherwise have a leakage current above a threshold. As used herein, leakage current generally refers to the current consumption of a circuit when the circuit is inactive. For example, a low dropout (LDO) regulator may be inactive (e.g., may not be generating a regulated voltage output), but may still consume power due to the leakage current of devices (e.g., transistors) used to implement the LDO regulator. In some aspects of the present disclosure, a switch may be opened to turn off power to circuits with a leakage current above a certain threshold.

Figure 4:
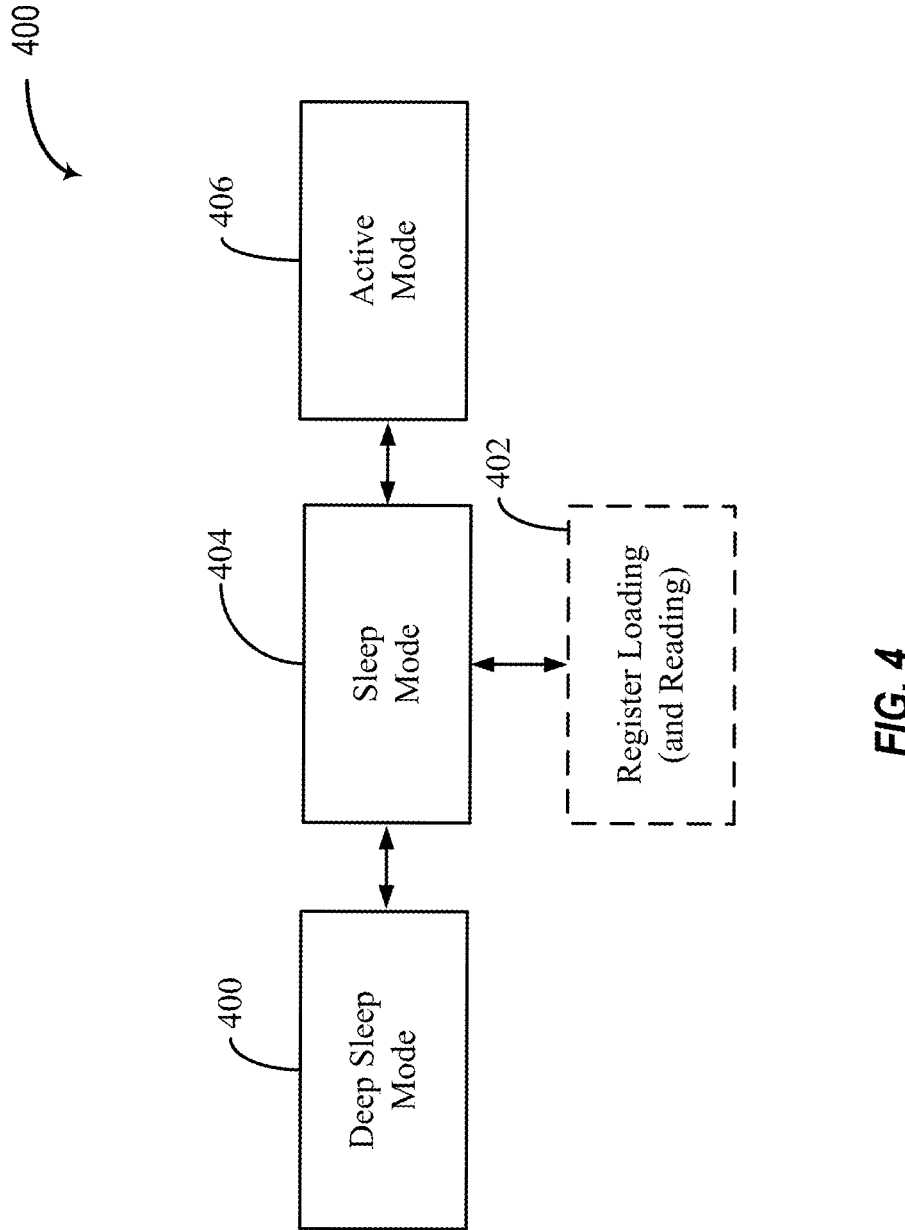
FIG. 4 illustrates different modes of an example front-end module (FEM) including a deep sleep mode, in which aspects of the present disclosure may be practiced.

FIG. 4 illustrates different modes of a FEM including a deep sleep mode, in accordance with certain aspects of the present disclosure. As shown, the FEM may operate in an active mode 406 (e.g., for data reception or transmission). In some cases, the FEM may be placed in a sleep mode 404 where certain circuits of the FEM may be placed in a low-power mode of operation (e.g., a low-current mode). For example, one or more oscillators, charge pump circuitry, power amplifier (PA), low-noise amplifier (LNA) (e.g., LNA 322 of FIG. 3), digital input/output (DIO) circuitry, and/or electronic fuse (efuse) circuitry (e.g., for storing default settings associated with the FEM) may be placed in a low-power mode of operation (e.g., deactivated).

In certain aspects, the FEM may be placed in a deep sleep mode 400 where current consumption may be reduced further than in sleep mode. In deep sleep mode, a head switch or tail switch may be used to turn off power to one or more circuits that have leakage currents that are greater than some threshold. The one or more circuits may be identified (e.g., via testing) to have leakage currents greater than the threshold. For example, the head switch or tail switch may be used to turn off power to any circuit that has a leakage current greater than 1 μA. For instance, in deep sleep mode, power may additionally be turned off to one or more low dropout (LDO) regulators for digital or analog circuitry or bandgap (BG) voltage generation circuitry. As used herein, a head switch may refer to a switch coupled between a circuit to be powered and a positive voltage rail (e.g., a positive power supply node), whereas a tail switch may refer to a switch coupled between the circuit and a reference potential node (e.g., electrical ground) or a negative voltage rail (e.g., a negative power supply node). While some examples provided herein are described with respect to a head switch to facilitate understanding, the aspects of the present disclosure may be implemented with a tail switch in a similar manner.

In some aspects, prior to turning off power to one or more circuits, status information associated with the one or more circuits may be stored in registers at block 402. By storing the status information before entering deep sleep mode 400 and reading this information upon exiting from the deep sleep mode, the one or more circuits may be directly configured with a setting the one or more circuits had prior to entering the sleep or deep sleep mode.

Figure 5:
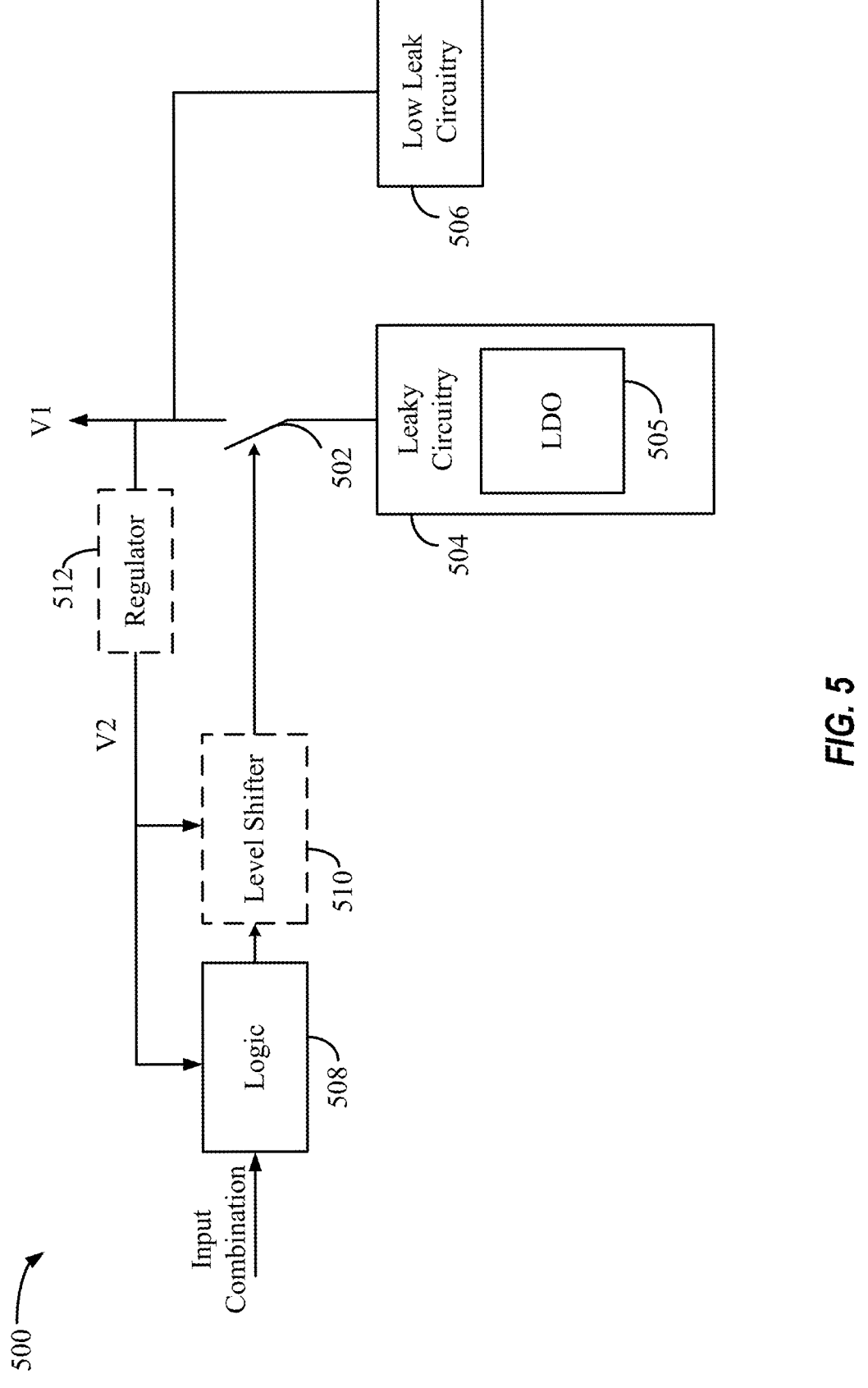
FIG. 5 is a block diagram illustrating example power management circuitry capable of activating a deep sleep mode, in which aspects of the present disclosure may be practiced.

FIG. 5 is a block diagram illustrating power management circuitry 500 for activating a deep sleep mode, in accordance with certain aspects of the present disclosure. As shown, the power management circuitry 500 may include a switch (e.g., a head switch 502) that may be coupled between a voltage rail (labeled "V1") and leaky circuitry 504. The head switch 502 may be implemented by a low leakage current transistor. Leaky circuitry 504 may refer to one or more circuits that have a leakage current that is above a threshold (e.g., 1 μA). For example, the leaky circuitry 504 may include an LDO regulator 505.

As shown, the voltage rail V1 may also be provided to low leakage circuitry 506. The low leakage circuitry may include circuitry with a leakage current lower than a threshold (e.g., 1 μA). For example, the low leakage circuitry 506 may include a PA, such as the PA 316 of FIG. 3. In other words, when deactivated, the PA 316 may consume little current (e.g., less than 1 μA), and thus, may be operated directly from the voltage rail V1 (e.g., as opposed to operating from voltage rail V1 through a head switch). Moreover, due to the high power consumption of the PA 316 when active, the PA 316 may be adversely impacted by the on-resistance of the head switch 502. Thus, the PA 316 (and/or other circuits with similar characteristics or concerns) may be directly coupled to the voltage rail V1 so that the current from the voltage rail V1 to the PA 316 does not pass through the head switch 502.

As shown, the power management circuitry 500 may include logic 508 for controlling the head switch 502. The logic 508 may include any suitable controller or processors configured to control the head switch 502. In some cases, the logic 508 may include a logical not-OR (NOR) gate, as described in more detail herein. In some aspects, the logic 508 may control the head switch 502 through a level shifter 510, as described in more detail herein. In some aspects, the logic 508 may receive an input combination (e.g., a digital input of 0000 as described below), in response to which, the logic 508 may output a logic high to open the head switch 502 and activate the deep sleep mode. In certain aspects, the logic 508 may operate from a voltage rail (V2). The voltage at the rail V2 may be generated based on the voltage at the rail V1 via a regulator 512, in some aspects.

Figure 6:
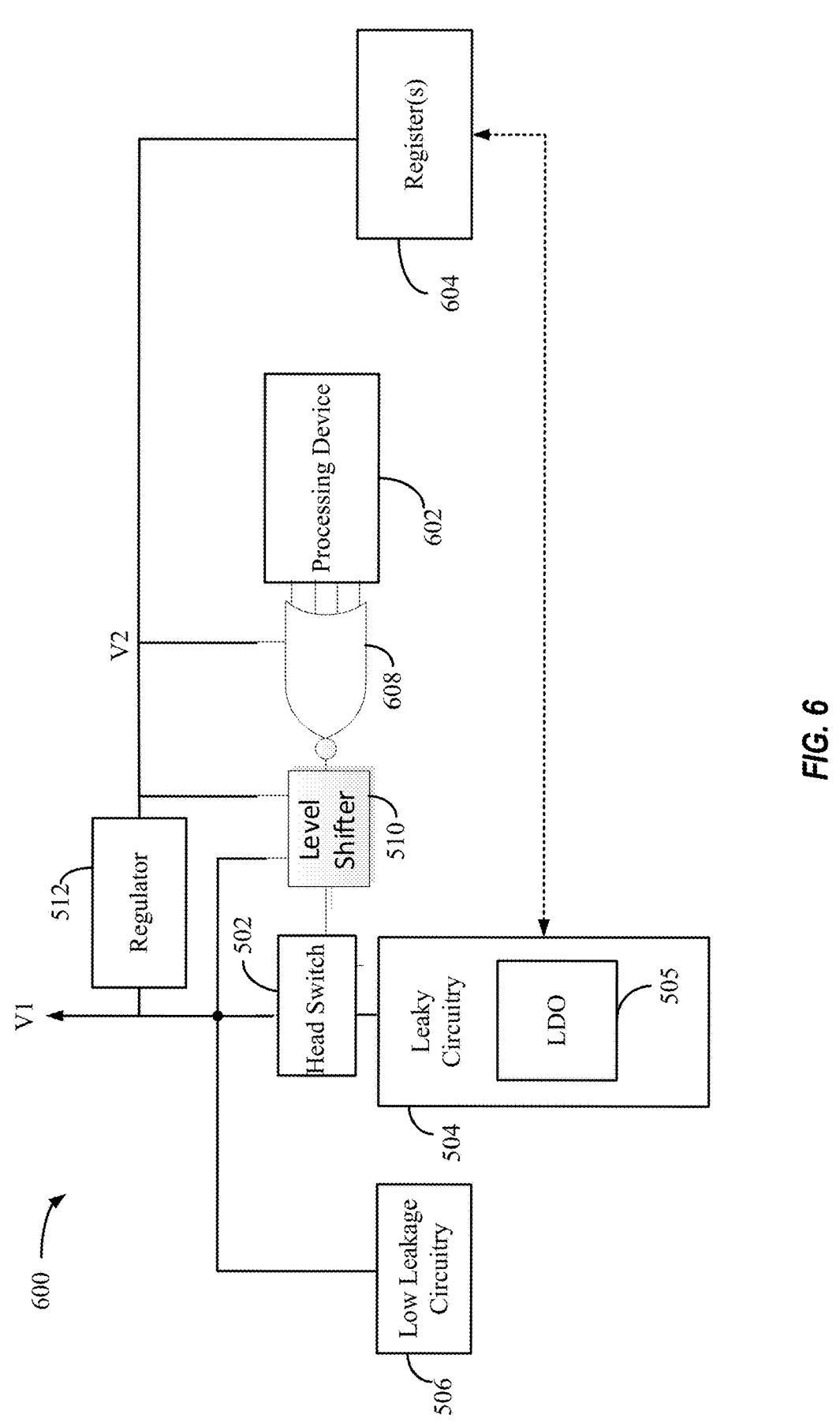
FIG. 6 is a block diagram illustrating example power management circuitry capable of activating a deep sleep mode with register retention, in which aspects of the present disclosure may be practiced.

FIG. 6 is a block diagram illustrating power management circuitry 600 for activating a deep sleep mode with register retention, in accordance with certain aspects of the present disclosure. As shown, the power management circuitry 600 may include one or more registers 604 that may be used to retain status information associated with the leaky circuitry 504 to which power may be turned off via the head switch 502 during deep sleep mode. As shown, power to the one or more registers 604 may remain on even when the head switch 502 is opened. In some aspects, the one or more registers 604 may operate using the voltage rail V2.

Prior to deep sleep mode, status information associated with the leaky circuitry 504 (or low leakage circuitry 506)

may be stored in the one or more registers 604. The status information may be used to reactivate the circuitry. For example, the status information may be stored for power-on reset (POR) circuitry, low dropout (LDO) regulators, and/or other digital circuits. In some aspects, status information associated with oscillator(s) and/or efuse data may be stored in the one or more registers 604. In some aspects, the information stored in registers prior to entering deep sleep mode may include, for example, LDO settings, one or more gain values for a receiver, or one or more power levels for a transmitter. Using the stored information, when exiting the deep sleep mode (to sleep mode and eventually to active mode), transceiver/front-end circuitry may be reactivated and directly configured back to a previous setting (e.g., back to the setting the system was in prior to entering sleep mode or deep sleep mode).

In some aspects, the FEM may first transition from deep sleep mode to sleep mode before transitioning to active mode. Sleep mode (e.g., standby mode) may take time to settle (e.g., associated with the settling time of BG voltage generation and LDO) upon existing deep sleep mode. To shorten the transition time from deep sleep mode to sleep mode (e.g., and finally to active mode), leaky circuitry 504 may use fast charging with high current consumption (e.g., a few mA) at a beginning phase of sleep mode and subsequently operate with normal current consumption (e.g., 10 μA) to reduce standby current during the remaining time in sleep mode.

As shown, the logic 508 may be implemented using a NOR gate 608. For example, if the NOR gate receives (e.g., from a processing device 602) an input combination of 0000, the NOR gate may output a logic high to a level shifter 510. With any other digital input combination, the NOR gate may output a logic low. The level shifter 510 may be used to drive the head switch 502. The head switch 502 may be implemented as a p-type metal-oxide-semiconductor (PMOS) transistor, which may be turned off to cut off power to the leaky circuitry 504 during deep sleep mode. In some cases, the head switch 502 may be implemented as a n-channel metal-oxide semiconductor (NMOS) transistor.

Example Logic Optimizing Power Switch Enable Delay to Reduce Power Up Latency

Certain aspects of the present disclosure generally relate to an apparatus for optimizing a delay time between staggered enable signals to power switches to reduce power up latency of logic circuits coupled to the power switches.

Power gating is a technique that cuts off power supply from a power source to the logic circuits (e.g., the logic circuits may be electrically coupled to an actual voltage supply VDD provided by an external power rail) that are not in use (e.g., when the logic circuits may not need to be powered up to save overall power consumption). For example, the logic circuits that are not in use may be temporarily turned off to reduce the power consumption. This temporary shutdown time may be called as "low power mode" or "inactive mode" of the logic circuits. When the logic circuits are required for operation once again, the logic circuits are activated to "active mode".

The two modes are switched at an appropriate time and in a suitable manner to maximize power performance while minimizing impact to operational performance of the logic circuits and an electronic device including the logic circuits. Thus the goal of the power gating is to reduce the power consumption by temporarily cutting the power off to selective logic circuits that are not required. Power gating may reduce dynamic power by 50% to 90%, depending on the logic circuit activity and the power gating granularity.

Power gating may be implemented by using devices such as power switches that are coupled (e.g., electrically coupled) to the logic circuits and the power source, and can turn on and off power from the power source to the logic circuits. For example, power gating may use transistors (e.g., p-channel metal-oxide semiconductor (PMOS) transistors) as header power switches to shut off power supplies from the power source to the logic circuits in a standby or sleep mode. In another example, power gating may use transistors (e.g., n-channel metal-oxide semiconductor (NMOS) transistors) as footer power switches to shut off power supplies from the power source to the logic circuits in the standby or sleep mode.

The power switches may be controlled using power switch enable signals (e.g., labeled En or EN). The enable signals may enable (e.g., turn on) the power switches to allow the power source to provide the power to the logic circuits. For example, when one of the enable signals may be asserted at one of the power switches, it may cause the respective one of the power switches to turn on to facilitate coupling of the logic circuits to the power source, and thereby powering the logic circuits.

The power switches may have built-in buffers/delays that may introduce a delay when the enable signals may traverse or are asserted at the power switches. For example, it may be desirable to introduce a delay, because turning on the logic circuits may cause a large current to be drawn by the logic circuits, causing a current spike or rush current. Introducing the delay between the times when each power switch turns on will spread out the turn-on time of the logic circuits, thereby reducing the current spike.

The power switches may be in groups and the enable signals may be used to turn on and off one group of the power switches at a time. This way, a last group of the power switches at an end of a shut-off sequence, or a first group of the power switches at a beginning of a power-on sequence, may handle the large current instead of a single power switch.

In some cases, multiple logic circuits may be coupled to a same power source. For example, a first logic circuit (e.g., a power domain 1) and a second logic circuit (e.g., a power domain 2) may be coupled to the same power source. A first set of power switches (e.g., two or more power switches) may be coupled to the first logic circuit and the power source. A second set of power switches (e.g., one or more power switches) may be coupled to the second logic circuit and the power source. In such cases, when turning on the power from the power source to the first logic circuit, if all of the first set of power switches coupled to the first logic circuit and the power source are enabled or turned on at a same time (e.g., simultaneously), then there may be a sudden instantaneous rate of current change in amperes per second (i.e., di/dt) at an adjacent second logic circuit, which is not desirable. This may happen because both the first logic circuit and the second logic circuit are coupled to the same power source, so any activity at the first logic circuit may affect the second logic circuit.

In order to mitigate the sudden instantaneous rate of current change at the second logic circuit when turning on the power from the power source to the first logic circuit, the enable signals to the first set of power switches coupled to the first logic circuit and the power source may be staggered (e.g., released and/or asserted at the first set of power switches in a staggered fashion). The staggered enable signals to the first set of power switches coupled to the first logic circuit and the power source may make certain that all of the first set of power switches coupled to the first logic circuit and the power source are not enabled at the same time (e.g., and are enabled in a staggered, sequential fashion). This may ensure that while turning on the power from the power source to the first logic circuit, there is no sudden instantaneous rate of current change at the second logic circuit.

An optimal staggering delay time between enable signals to power switches coupled to a logic circuit and a power source may not be available at a design stage of a device including the logic circuits and the power switches. Currently, the delay time between the enable signals to the power switches coupled to the logic circuit and the power source may be based on a fixed time value (e.g., which may be determined using a timer).

For example, a first enable signal to one of the power switches may be asserted at a first time value and a second enable signal to one of the power switches may be asserted at a second time value (e.g., which is after some fixed time value from the first time value). Similarly, a third enable signal to one of the power switches may be asserted at a third time value (e.g., which may also be after the fixed time value from the second time value).

In some cases, the delay time between the enable signals to the power switches coupled to the logic circuit and the power source may be based on enable acknowledge signals (e.g., which may be associated with the enable signals and may indicate successful assertion of the enable signals at the power switches).

Figure 7:
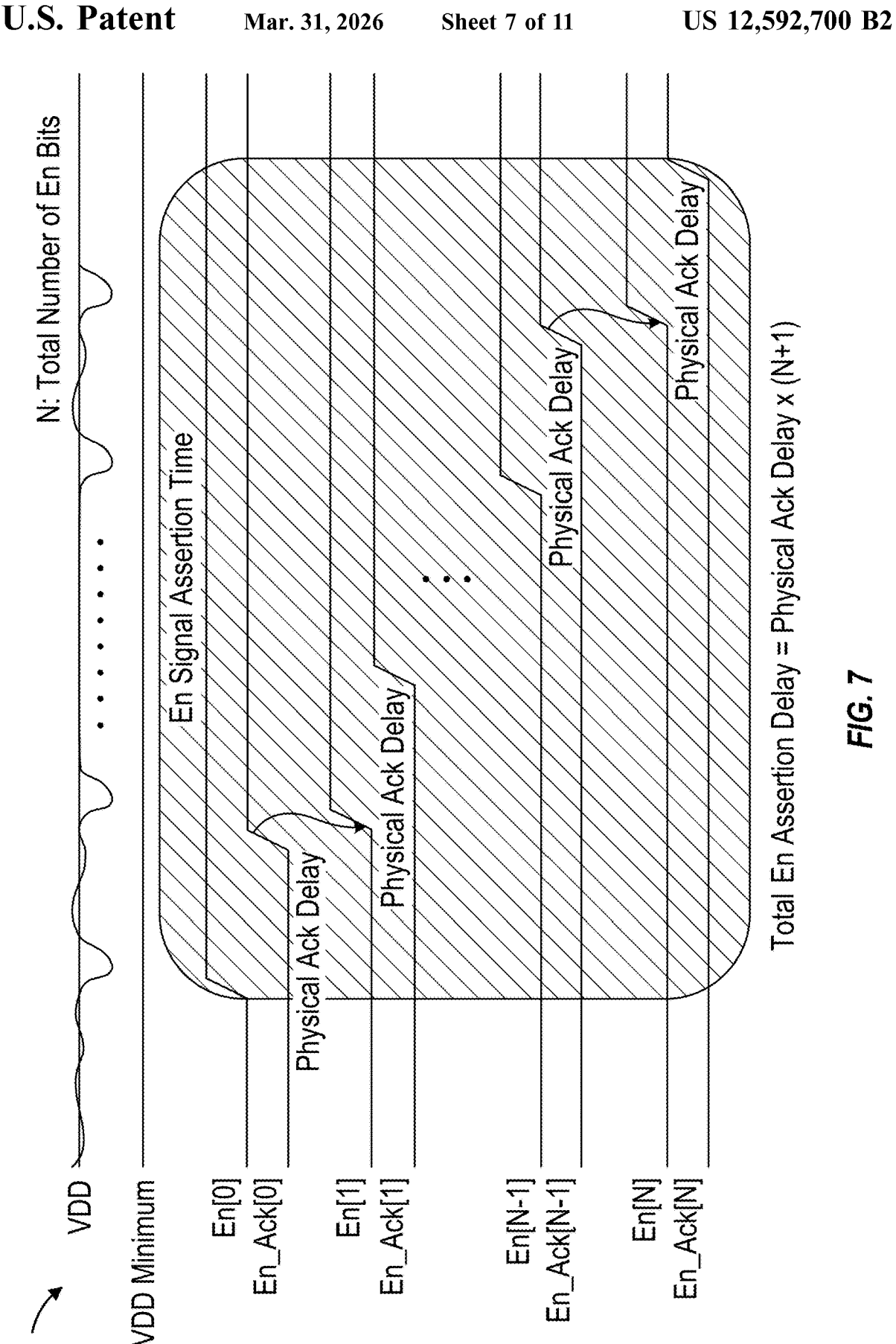
FIG. 7 illustrates power switch enable delay time between enable signals to power switches that is based on enable acknowledge signals or a fixed value.

For example, as illustrated in a diagram 700 of FIG. 7, a first enable signal (e.g., labeled En(0)) to one of the power switches may be asserted at a first time value. Upon assertion of the first enable signal at the one of the power switches, a first enable acknowledge signal (e.g., labeled En_Ack(0)) corresponding to the first enable signal is received (e.g., with a physical acknowledge delay time) at a controller. After receiving the first enable acknowledge signal, a second enable signal (e.g., labeled En(1)) to one of the power switches may be asserted at a second time value. That is, the second enable signal may be transmitted only after receiving the first enable acknowledge signal corresponding to the first enable signal. Upon assertion of the second enable signal at the one of the power switches, a second enable acknowledge signal (e.g., labeled En_Ack(1)) corresponding to the second enable signal is received (e.g., with the physical acknowledge delay time) at the controller. After receiving the second enable acknowledge signal, a third enable signal (e.g., En(2)) to one of the power switches may be asserted at a third time value. That is, the third enable signal may be transmitted only after receiving the second enable acknowledge signal corresponding to the second enable signal. In this example case, a total enable signal assertion delay (e.g., for all the enable signals to the power switches) may be based on the physical acknowledge delay time and a number of the enable signals to the power switches (i.e., the total enable signal assertion delay=the physical acknowledge delay time×(N+1)). N indicates the number of the enable signals to the power switches.

The staggering delay time between the enable signals to the power switches coupled to the logic circuit and the power source may contribute to a longer power up latency of the logic circuit. Because of a longer power up delay of the logic circuit, a software system associated with the logic circuit may lose an opportunity to utilize a power saving mode by turning off the logic circuit (e.g., when the logic circuit may not be needed) and turning on the logic circuit (e.g., only when the logic circuit may be needed) to save the power consumption. The longer power up latency of the logic circuit may also degrade an overall performance of the device including the logic circuit.

Techniques described herein provide an optimal staggering delay time between transmission of enable signals to power switches (e.g., which may be electrically coupled to logic circuits and a power source). The optimal staggering delay time may allow enabling or turning on of the power switches in a staggered, sequential fashion while reducing power up latency of the logic circuits.

In one aspect, a configurable value for the optimal staggering delay time between the transmission of the enable signals to the power switches may be used. The configurable value for the optimal staggering delay time may be achieved and determined based on post silicon data, in order to minimize any unnecessary delay between the transmission of the enable signals to the power switches (e.g., and thereby reduce the power up latency of the logic circuits). In another aspect, multiple enable signals may be asserted at once to speed up turning on or enabling of the power switches. This may enhance the power up speed of the logic circuits with aid of configurable staggering delays between the transmission of the enable signals to the power switches.

The techniques proposed herein may determine and provide the optimal staggering delay time between the transmission of the enable signals to the power switches, which may reduce the power up latency of the logic circuits, and thereby improve performance and prolong a day of use (DOU) of a machine including such logic circuits. The techniques proposed herein may be further understood with reference to FIG. 8-FIG. 11.

Figure 8:
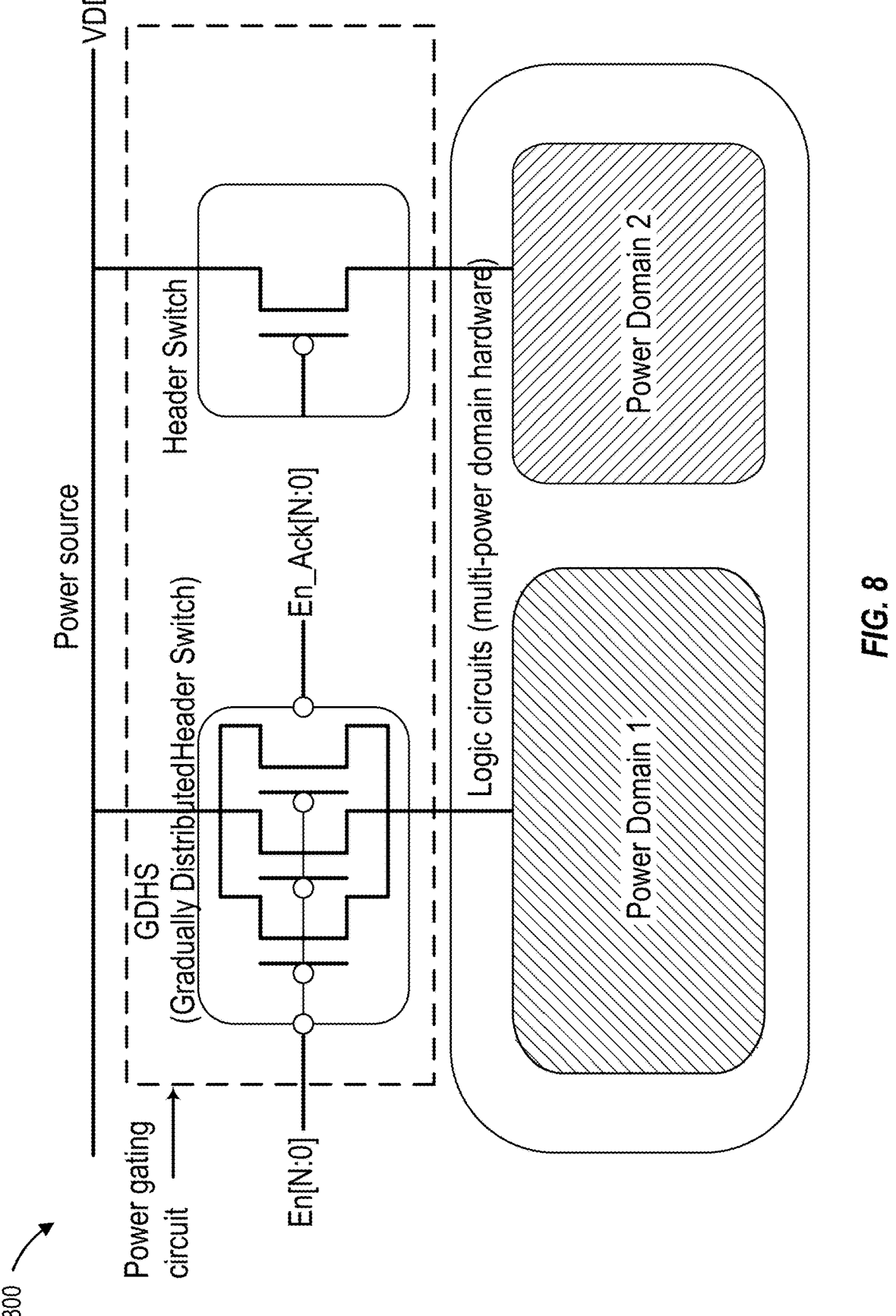
FIG. 8 is a block diagram illustrating example power management system, in accordance with certain aspects of the present disclosure.

FIG. 8 is a block diagram 800 illustrating example power management system, in accordance with certain aspects of the present disclosure.

The power management system includes logic circuits. The logic circuits may process a same task or different tasks. A power source may be coupled to each of the logic circuits and may generate power for each of the logic circuits. In one example, a same power source may be coupled to each of the logic circuits. In another example, different power sources may be coupled to different logic circuits.

The power management system may also include a power gating circuit (or module), which may be associated with (e.g., electrically coupled to) the logic circuits and the power source. For example, the power gating circuit may be situated between the logic circuits and the power source, and may selectively couple and decouple the logic circuits to the power source. When the logic circuits are coupled to the power source via the power gating circuit, the logic circuits may receive power from the power source. When the logic circuits are not coupled to the power source, the logic circuits may not receive the power from the power source.

The power gating circuit may perform this coupling and decoupling on an independent basis for each of the logic circuits. For example, the power gating circuit may couple and decouple one logic circuit (e.g., a first logic circuit) to and from the power source independently of coupling and decoupling another logic circuit (e.g., a second logic circuit) from the power source.

As another example, rather than independently coupling each of the logic circuits, the power gating circuit may couple and decouple various groupings or combinations of the logic circuits from the power source. For instance, the power gating circuit may couple and decouple a first group of logic circuits (e.g., two logic circuits) to and from the power source independently of coupling and decoupling a second group of logic circuits (e.g., three logic circuits) from the power source.

The power gating circuit may include multiple power switches. One or more power switches may be associated with or coupled to a different one of the logic circuits. For example, two or more power switches may be coupled to the first logic circuit and a single power switch may be coupled to the second logic circuit. In another example, a first group of power switches (e.g., three power switches) may be coupled to the first logic circuit and a second group of power switches (e.g., four power switches) may be coupled to the second logic circuit.

The power source may include a power rail in communication with the logic circuits and/or a ground rail in communication with the logic circuits. The power gating circuit may independently control the power switches to selectively couple and decouple one of the power rail and/or the ground rail to and from the logic circuits. In one example, the power switches may be head switches positioned between a voltage supply provided by the power rail and the logic circuits to couple the logic circuits to the power rail. In another example, the power switches may be footswitches positioned between the logic circuits and ground nodes of the ground rail to couple the logic circuits to the ground rail.

The power gating circuit may include a controller, a driver module and/or an intermediate software intelligence layer that may control the power switches to selectively couple and decouple the individual logic circuits to the power source. For example, the controller may generate, use, implement, and/or assert power switch enable signals to control enabling of the power switches. For instance, the enable signals may enable or turn on the power switches. The enabled power switches may facilitate the coupling of the logic circuits to the power source via the enabled power switches, and the logic circuits may then be able to receive the power from the power source. In another example, one or more disable or sleep signals may be used to disable (or turn off) the power switches, which may lead to decoupling of the logic circuits to the power source and the logic circuits may then not be able to receive the power from the power source.

In certain aspects, a transmission time difference between the enable signals to the power switches may include an optimal delay time. A configurable value of the optimal delay time between transmission of two enable signals to the power switches (e.g., may not be fixed and is variable) and may be determined based on processing of post silicon data. For example, the configurable value of the optimal delay time between the transmission of the two enable signals to the power switches may be such that there is no unnecessary delay between the two enable signals to the power switches. When there is no unnecessary delay between the two enable signals to the power switches, a power up latency of the logic circuits coupled to the power source via the enabled power switches may be substantially reduced.

In certain aspects, the optimal delay time between the transmission of any two enable signals (e.g., of multiple enable signals) to the power switches may be same. For example, firstly, a first enable signal may be transmitted to a first power switch at a first time value and then a second enable signal may be transmitted to a second power switch at a second time value. The difference between the first time value and the second time value may be a first configurable value of the delay time (e.g., one second). After the second enable signal, a third enable signal may be transmitted to a third power switch at a third time value. The difference between the second time value and the third time value may also be the first configurable value of the delay time (e.g., one second).

In certain aspects, the optimal delay time between transmission of any two enable signals (e.g., of the multiple enable signals) to the power switches may be different. For example, firstly, a first enable signal may be transmitted to a first power switch at a first time value and then a second enable signal may be transmitted to a second power switch at a second time value. The difference between the first time value and the second time value may be a first configurable value of the delay time (e.g., one second). After the second enable signal, a third enable signal may be transmitted to a third power switch at a third time value. The difference between the second time value and the third time value may be a second configurable value of the delay time (e.g., two seconds).

In certain aspects, the optimal delay time between the transmission of a first set of enable signals (e.g., of the multiple enable signals) to the power switches may be same, while the optimal delay time between the transmission of a second set of enable signals (e.g., of the multiple enable signals) to the power switches may be different. For example, firstly, a first enable signal may be transmitted to a first power switch at a first time value and then a second enable signal may be transmitted to a second power switch at a second time value. The difference between the first time value and the second time value may be a first configurable value of the delay time (e.g., one second). After the second enable signal, a third enable signal may be transmitted to a third power switch at a third time value. The difference between the second time value and the third time value may also be the first configurable value of the delay time (e.g., one second). After the third enable signal, a fourth enable signal may be transmitted to a fourth power switch at a fourth time value. The difference between the third time value and the fourth time value may be a second configurable value of the delay time (e.g., two seconds).

Figure 9:
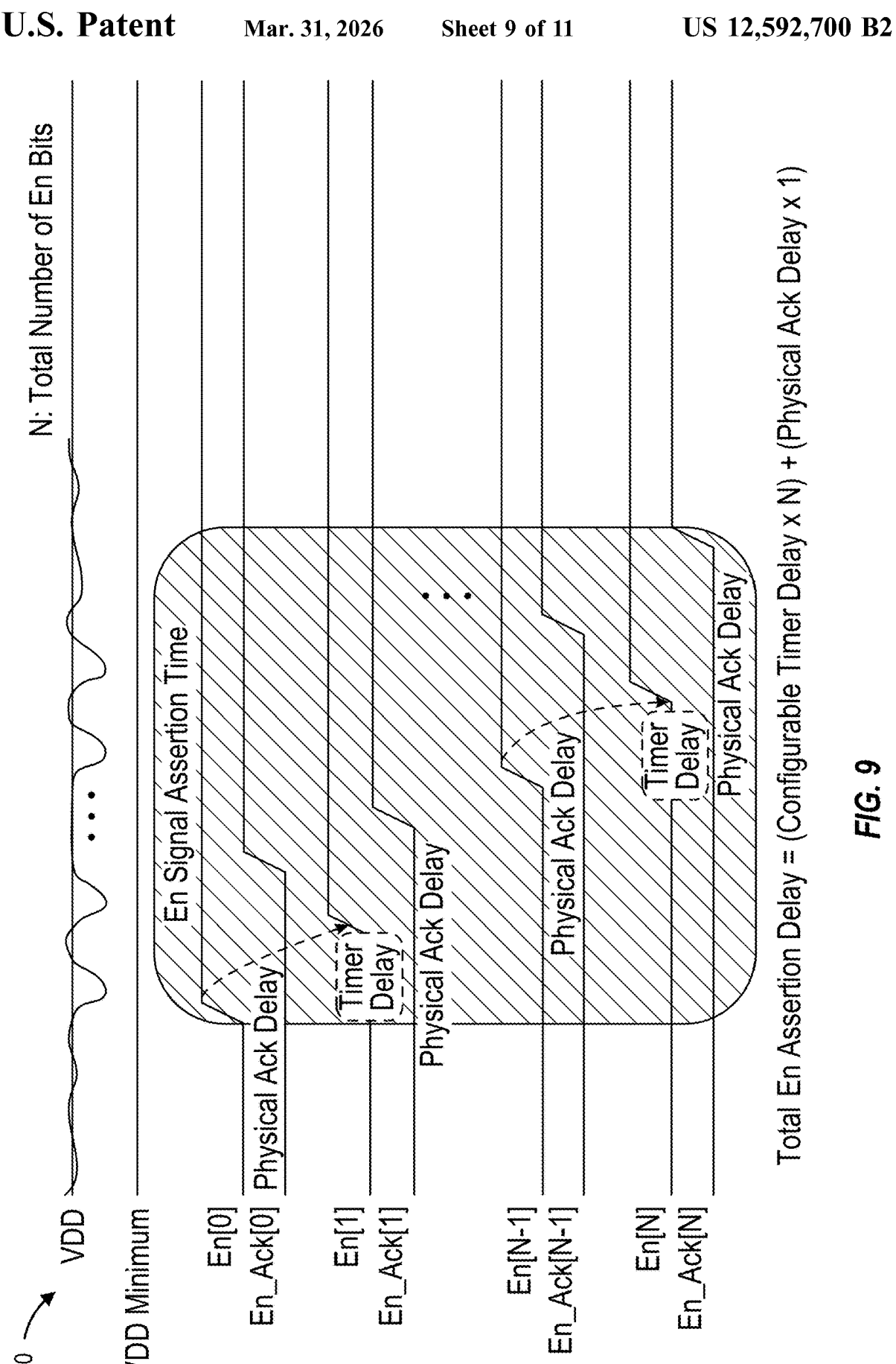
FIG. 9 illustrates a first example of power switch enable delay time between enable signals to power switches, in accordance with certain aspects of the present disclosure.

As illustrated in a diagram 900 of FIG. 9, a first enable signal (e.g., labeled En(0)) to a first power switch may be asserted at a first time value and a second enable signal (e.g., labeled En(1)) to a second power switch may be asserted at a second time value (e.g., which is after the first time value). The difference between the first time value and the second time value may be a first configurable value of a delay time between transmission of the enable signals. The first configurable value of the delay time is less than a delay time value between the transmission of the enable signals that may be based on a physical acknowledge delay time, which is associated with a first enable acknowledge signal (e.g., labeled En_Ack(0)) corresponding to the first enable signal. That is, the second enable signal may be transmitted to the second power switch prior to receipt of the first enable acknowledge signal corresponding to the first enable signal. Similarly, each enable signal may be transmitted or asserted prior to receipt of an enable acknowledge signal corresponding to a preceding enable signal. This may reduce enable signal assertion delay for all the enable signals to the power switches.

In certain aspects, multiple enable signals may be asserted at once to speed up turning on (or enabling) of a subset of power switches from all power switches. For example, two or more enable signals may be transmitted to two or more power switches (e.g., for enabling the two or more power switches) at a same time.

In certain aspects, the optimal delay time between the transmission of each set of enable signals to each set of power switches may be same. For example, firstly, a first enable signal may be transmitted to a first power switch and a second enable signal may be transmitted to a second power switch at a first time value. Subsequently, a third enable signal may be transmitted to a third power switch and a fourth enable signal may be transmitted to a fourth power switch at a second time value. The difference between the first time value and the second time value may be a first configurable value of a delay time (e.g., one second) between transmission of different sets of enable signals. Then, a fifth enable signal may be transmitted to a fifth power switch and a sixth enable signal may be transmitted to a sixth power switch at a third time value. The difference between the second time value and the third time value may also be the first configurable value of the delay time (e.g., one second) between the transmission of the different sets of enable signals.

In certain aspects, the optimal delay time between the transmission of each set of enable signals to each set of power switches may be different. For example, firstly, a first enable signal may be transmitted to a first power switch and a second enable signal may be transmitted to a second power switch at a first time value. Subsequently, a third enable signal may be transmitted to a third power switch and a fourth enable signal may be transmitted to a fourth power switch at a second time value. The difference between the first time value and the second time value may be a first configurable value of the delay time (e.g., one second) between transmission of different sets of enable signals. Then, a fifth enable signal may be transmitted to a fifth power switch and a sixth enable signal may be transmitted to a sixth power switch at a third time value. The difference between the second time value and the third time value may be a second configurable value of the delay time (e.g., two seconds) between the transmission of the different sets of enable signals.

Figure 10:
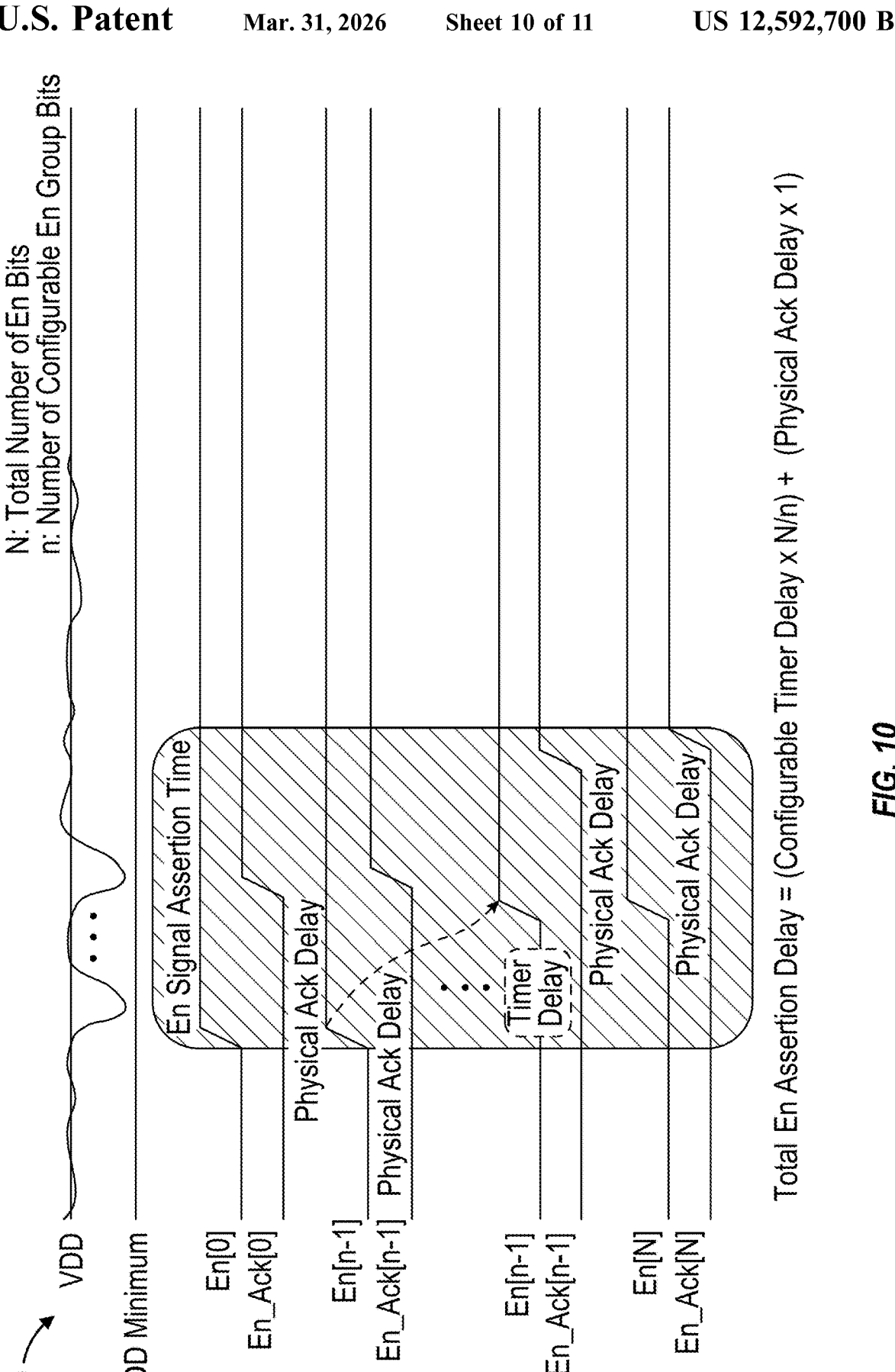
FIG. 10 illustrates a second example of power switch enable delay time between enable signals to power switches, in accordance with certain aspects of the present disclosure.

As illustrated in a diagram 1000 of FIG. 10, a first enable signal (e.g., labeled En(0)) to a first power switch and a second enable signal (e.g., labeled En(n−1)) to a second power switch may be asserted at a first time value. Another set of enable signals may be asserted at different power switches at a second time value (e.g., which is after the first time value). The difference between the first time value and the second time value may be a first configurable value of the delay time between transmission of different sets of enable signals. The first configurable value of the delay time may be less than a delay time value that may be based on a physical acknowledge delay time associated with a first enable acknowledge signal (e.g., labeled En_Ack(0)) for the first enable signal or a physical acknowledge delay time associated with a second enable acknowledge signal (e.g., labeled En_Ack(n−1)) for the second enable signal. This may reduce enable signal assertion delay for all the enable signals to the power switches.

In some aspects, this staggering of enabling of power switches may enable a restarting of a power flow to logic circuits to occur at a gradual rate, or at least at a stair-stepped incremental rate. Consequently, a rate of change of a current drawn by the logic circuits from a shared power source is managed at a reduced level. Accordingly, a voltage drop on the shared power source can be avoided or at least reduced, and other logic circuits that are coupled to the shared power source can continue to operate reliably while power up operations are performed for individual logic circuits.

FIG. 11 is a flow diagram illustrating example operations 1100 for power management, in accordance with certain aspects of the present disclosure. The operations 1100 may be performed, for example, at or by a power gating circuit, such as the power gating circuit of FIG. 8.

Method 1100 begins at 1110 with receiving a plurality of enable signals from a set of enable signals at different times for enabling a plurality of power switches of the power gating circuit.

In certain aspects, one or more values of a time delay period between any two enable signals of the plurality of enable signals may be configurable.

In certain aspects, the power gating circuit may be associated with (or coupled to) one or more logic circuits and a power source. For example, the power gating circuit may be coupled to and positioned between the one or more logic circuits and the power source.

Method 1100 then proceeds to 1120 with enabling the plurality of power switches at the different times based on the plurality of enable signals.

In certain aspects, the one or more values of the time delay period may be based on at least one of: a number of the plurality of power switches or the power source.

In certain aspects, the method 1100 further includes receiving a plurality of acknowledgment signals, in response to the plurality of enable signals enabling the plurality of power switches.

In certain aspects, the one or more values of the time delay period may be based on a plurality of acknowledgment signal delay periods associated with the plurality of acknowledgment signals.

In certain aspects, different time delay periods between different enable signals of the plurality of enable signals may have different values.

In certain aspects, the time delay period between any two enable signals of the plurality of enable signals may have a same value.

In certain aspects, the method 1100 further includes receiving a first enable signal of the plurality of enable signals at a first time and a second enable signal of the plurality of enable signals at a second time. The second time is after the first time. In certain aspects, the method 1100 further includes enabling a first power switch of the plurality of power switches based on the first enable signal at the first time and a second power switch of the plurality of power switches based on the second enable signal at the second time.

In certain aspects, the first power switch may be enabled at the first time to turn on power from the power source to the one or more logic circuits and the second power switch may be enabled at the second time to turn on the power from the power source to the one or more logic circuits.

In certain aspects, the method 1100 further includes receiving at least two enable signals from the set of enable signals at a same time for enabling at least two power switches of the plurality of power switches. In certain aspects, the method 1100 further include enabling the at least two power switches at the same time based on the at least two enable signals.

In certain aspects, the method 1100 further includes receiving a first enable signal and a second enable signal of the plurality of enable signals at a first time and a third enable signal of the plurality of enable signals at a second time. The second time is after the first time. In certain aspects, the method 1100 further includes enabling a first power switch of the plurality of power switches based on the first enable signal at the first time, a second power switch of the plurality of power switches based on the second enable signal at the first time, and a third power switch of the plurality of power switches based on the third enable signal at the second time.

EXAMPLE CLAUSES

Implementation examples are described in the following numbered clauses:

Clause 1: A method at a power gating circuit, comprising: receiving a plurality of enable signals from a set of enable signals at different times for enabling a plurality of power switches of the power gating circuit, wherein one or more values of a time delay period between any two enable signals of the plurality of enable signals are configurable, and wherein the power gating circuit is positioned between one or more logic circuits and a power source; and enabling the plurality of power switches at the different times based on the plurality of enable signals.

Clause 2: The method of clause 1, wherein the one or more values of the time delay period are based on at least one of: a number of the plurality of power switches or the power source.

Clause 3: The method of any one of clauses 1-2, further comprising receiving a plurality of acknowledgment signals, in response to the plurality of enable signals enabling the plurality of power switches.

Clause 4: The method of clause 3, wherein the one or more values of the time delay period are based on a plurality of acknowledgment signal delay periods associated with the plurality of acknowledgment signals.

Clause 5: The method of any one of clauses 1-4, wherein different time delay periods between different enable signals of the plurality of enable signals have different values.

Clause 6: The method of any one of clauses 1-5, wherein the time delay period between any two enable signals of the plurality of enable signals has a same value.

Clause 7: The method of any one of clauses 1-6, further comprising: receiving a first enable signal of the plurality of enable signals at a first time and a second enable signal of the plurality of enable signals at a second time, wherein the second time is after the first time; and enabling a first power switch of the plurality of power switches based on the first enable signal at the first time and a second power switch of the plurality of power switches based on the second enable signal at the second time.

Clause 8: The method of clause 7, wherein the first power switch is enabled at the first time to turn on power from the power source to the one or more logic circuits and the second power switch is enabled at the second time to turn on the power from the power source to the one or more logic circuits.

Clause 9: The method of any one of clauses 1-8, further comprising: receiving at least two enable signals from the set of enable signals at a same time for enabling at least two power switches of the plurality of power switches; and enabling the at least two power switches at the same time based on the at least two enable signals.

Clause 10: The method of clause 9, further comprising: receiving a first enable signal and a second enable signal of the plurality of enable signals at a first time and a third enable signal of the plurality of enable signals at a second time, wherein the second time is after the first time; and enabling a first power switch of the plurality of power switches based on the first enable signal at the first time, a second power switch of the plurality of power switches based on the second enable signal at the first time, and a third power switch of the plurality of power switches based on the third enable signal at the second time.

Clause 11: An apparatus, comprising: at least one memory comprising instructions; and one or more processors configured, individually or in any combination, to execute the instructions and cause the apparatus to perform a method in accordance with any one of Clauses 1-10.

Clause 12: An apparatus, comprising means for performing a method in accordance with any one of Clauses 1-10.

Clause 13: A non-transitory computer-readable medium comprising executable instructions that, when executed by one or more processors of an apparatus, cause the apparatus to perform a method in accordance with any one of Clauses 1-10.

Clause 14: A computer program product embodied on a computer-readable storage medium comprising code for performing a method in accordance with any one of Clauses 1-10.

ADDITIONAL CONSIDERATIONS

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An apparatus for power management, comprising:
one or more logic circuits; and
a power gating circuit associated with the one or more logic circuits and a power source, wherein the power gating circuit comprises a plurality of power switches and is configured to:
receive a plurality of enable signals from a set of enable signals at different times for enabling the plurality of power switches, wherein one or more values of a time delay period between any two enable signals of the plurality of enable signals are configurable;
enable the plurality of power switches at the different times based on the plurality of enable signals; and
receive a plurality of acknowledgment signals, in response to the plurality of enable signals enabling the plurality of power switches.

2. The apparatus of claim 1, wherein the one or more values of the time delay period are based on at least one of: a number of the plurality of power switches or the power source.

3. The apparatus of claim 1, wherein the one or more values of the time delay period are based on a plurality of acknowledgment signal delay periods associated with the plurality of acknowledgment signals.

4. The apparatus of claim 1, wherein different time delay periods between different enable signals of the plurality of enable signals have different values.

5. The apparatus of claim 1, wherein the time delay period between any two enable signals of the plurality of enable signals has a same value.

6. The apparatus of claim 1, wherein the power gating circuit is configured to:

receive a first enable signal of the plurality of enable signals at a first time and a second enable signal of the plurality of enable signals at a second time, wherein the second time is after the first time; and enable a first power switch of the plurality of power switches based on the first enable signal at the first time and a second power switch of the plurality of power switches based on the second enable signal at the second time.

7. The apparatus of claim 6, wherein the first power switch is enabled at the first time to turn on power from the power source to the one or more logic circuits and the second power switch is enabled at the second time to turn on the power from the power source to the one or more logic circuits.

8. The apparatus of claim 1, wherein the power gating circuit is configured to:

receive at least two enable signals from the set of enable signals at a same time for enabling at least two power switches of the plurality of power switches; and enable the at least two power switches at the same time based on the at least two enable signals.

9. The apparatus of claim 8, wherein the power gating circuit is configured to:

receive a first enable signal and a second enable signal of the plurality of enable signals at a first time and a third enable signal of the plurality of enable signals at a second time, wherein the second time is after the first time; and enable a first power switch of the plurality of power switches based on the first enable signal at the first time, a second power switch of the plurality of power switches based on the second enable signal at the first time, and a third power switch of the plurality of power switches based on the third enable signal at the second time.

10. A method for a power gating circuit, comprising:

receiving a plurality of enable signals from a set of enable signals at different times for enabling a plurality of power switches of the power gating circuit, wherein one or more values of a time delay period between any two enable signals of the plurality of enable signals are configurable, and wherein the power gating circuit is associated with one or more logic circuits and a power source;

enabling the plurality of power switches at the different times based on the plurality of enable signals; and receiving a plurality of acknowledgment signals, in response to the plurality of enable signals enabling the plurality of power switches.

11. The method of claim 10, wherein the one or more values of the time delay period are based on at least one of: a number of the plurality of power switches or the power source.

12. The method of claim 10, wherein the one or more values of the time delay period are based on a plurality of acknowledgment signal delay periods associated with the plurality of acknowledgment signals.

13. The method of claim 10, wherein different time delay periods between different enable signals of the plurality of enable signals have different values.

14. The method of claim 10, wherein the time delay period between any two enable signals of the plurality of enable signals has a same value.

15. The method of claim 10, further comprising:

receiving a first enable signal of the plurality of enable signals at a first time and a second enable signal of the plurality of enable signals at a second time, wherein the second time is after the first time; and enabling a first power switch of the plurality of power switches based on the first enable signal at the first time and a second power switch of the plurality of power switches based on the second enable signal at the second time.

16. The method of claim 15, wherein the first power switch is enabled at the first time to turn on power from the power source to the one or more logic circuits and the second power switch is enabled at the second time to turn on the power from the power source to the one or more logic circuits.

17. The method of claim 10, further comprising:

receiving at least two enable signals from the set of enable signals at a same time for enabling at least two power switches of the plurality of power switches; and enabling the at least two power switches at the same time based on the at least two enable signals.

18. The method of claim 17, further comprising:

receiving a first enable signal and a second enable signal of the plurality of enable signals at a first time and a third enable signal of the plurality of enable signals at a second time, wherein the second time is after the first time; and enabling a first power switch of the plurality of power switches based on the first enable signal at the first time, a second power switch of the plurality of power switches based on the second enable signal at the first time, and a third power switch of the plurality of power switches based on the third enable signal at the second time.

* * * * *